(12) United States Patent
Hsu et al.

(10) Patent No.: US 10,963,072 B2
(45) Date of Patent: Mar. 30, 2021

(54) KEY STRUCTURE AND KEYBOARD MODULE

(71) Applicants: LITE-ON ELECTRONICS (GUANGZHOU) LIMITED, Guangzhou (CN); Lite-On Technology Corporation, Taipei (TW)

(72) Inventors: Kuo-Hui Hsu, Taipei (TW); Cheng-Kun Liao, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 16/840,433

(22) Filed: Apr. 5, 2020

(65) Prior Publication Data

US 2020/0343055 A1 Oct. 29, 2020

Related U.S. Application Data

(60) Provisional application No. 62/838,310, filed on Apr. 25, 2019.

(30) Foreign Application Priority Data

Jan. 13, 2020 (CN) .......................... 202010030354.6

(51) Int. Cl.
*H01H 13/7065* (2006.01)
*G06F 3/0354* (2013.01)
(Continued)

(52) U.S. Cl.
CPC ..... *G06F 3/03543* (2013.01); *H01H 13/7065* (2013.01); *H01H 13/83* (2013.01); *H05K 1/118* (2013.01); *H05K 1/189* (2013.01); *H01H 2209/002* (2013.01); *H01H 2219/06* (2013.01); *H01H 2219/062* (2013.01); *H01H 2219/064* (2013.01); *H05K 2201/0989* (2013.01);
(Continued)

(58) Field of Classification Search
CPC .... H01H 3/125; H01H 13/14; H01H 13/7065; H01H 13/705; H01H 13/70; H01H 3/12; H01H 15/16; H01H 2237/00; H01H 13/20; H01H 13/50
See application file for complete search history.

(56) References Cited

U.S. PATENT DOCUMENTS

| 2004/0074753 A1* | 4/2004 | Chen | H01H 3/125 200/344 |
| 2012/0048698 A1* | 3/2012 | Yen | H01H 3/122 200/344 |

* cited by examiner

*Primary Examiner* — Ahmed M Saeed
(74) *Attorney, Agent, or Firm* — JCIPRNET

(57) ABSTRACT

Provided is a key structure including a base plate having at least one connecting seat and at least one notch adjacent to a lower portion of the connecting seat; a keycap disposed above the base plate in a liftable manner; a thin film circuit assembly disposed on the base plate and located between the base plate and the keycap; and a supporting rod connected to the keycap and the base plate and located between the thin film circuit assembly and the keycap. An accommodating space formed by the notch extends from and communicates with a through hole of the connecting seat. The connecting seat protrudes out from an opening of the thin film circuit assembly. A vertical projection region of the notch on the base plate is located within a vertical projection region of the opening on the base plate. The invention also provides a keyboard module.

18 Claims, 17 Drawing Sheets

(51) Int. Cl.
*H05K 1/11* (2006.01)
*H05K 1/18* (2006.01)
*H01H 13/83* (2006.01)
(52) U.S. Cl.
CPC .............. *H05K 2201/09236* (2013.01); *H05K 2201/09263* (2013.01); *H05K 2201/09663* (2013.01); *H05K 2201/10022* (2013.01); *H05K 2201/10106* (2013.01)

KEY STRUCTURE AND KEYBOARD MODULE

CROSS REFERENCE TO RELATED APPLICATION

This application claims the priority benefits of U.S. provisional application Ser. No. 62/838,310, filed on Apr. 25, 2019 and China application serial no. 202010030354.6, filed on Jan. 13, 2020. The entirety of each of the above-mentioned patent applications is hereby incorporated by reference herein and made a part of specification.

BACKGROUND OF THE INVENTION

1. Field of the Invention

The invention relates to a key structure and a keyboard module.

2. Description of Related Art

A keyboard is an input interface commonly applied to an electronic device, and a user inputs information by pressing a keycap of a key structure. To make lifting of the keycap stable and smooth, a supporting rod may be disposed between the keycap and a base plate, and to provide sufficient structure strength, the base plate and the supporting rod are mostly made of metal. Therefore, in a process in which the keycap is pressed down and the supporting rod moves with the keycap, the supporting rod is likely to strike the base plate to produce abnormal sound of metal striking.

SUMMARY OF THE INVENTION

The invention is directed to a key structure, which may avoid abnormal sound produced by a supporting rod striking a base plate.

According to an embodiment of the invention, the key structure includes a base plate, a keycap, a thin film circuit assembly, and a supporting rod. The base plate includes at least one connecting seat and at least one notch adjacent to a lower portion of the at least one connecting seat, wherein the connecting seat includes a through hole, and the notch is communicated with the corresponding through hole of the connecting seat. The keycap is disposed above the base plate. The thin film circuit assembly is disposed on the base plate and is located between the base plate and the keycap. The thin film circuit assembly includes at least one opening, the connecting seat protrudes out from the opening, and a vertical projection region of the notch on the base plate is located within a vertical projection region of the opening of the thin film circuit assembly on the base plate. The supporting rod is connected to the keycap and the base plate and is located between the thin film circuit assembly and the keycap. A free end of the supporting rod is inserted into the through hole, and a lower portion of the free end of the supporting rod abuts against an edge of the opening of the thin film circuit assembly.

In the key structure according to an embodiment of the invention, the base plate includes a main body, and the connecting seat is substantially perpendicularly disposed relative to the main body.

In the key structure according to an embodiment of the invention, the notch may or may not penetrate through the main body of the base plate.

In the key structure according to an embodiment of the invention, the notch may form an accommodating space on the main body of the base plate, and the accommodating space may extend from the through hole and be communicated with the through hole.

In the key structure according to an embodiment of the invention, the notch may include a first and a second side edges which are opposite to each other, and a third and a fourth side edges which are opposite to each other, and an extending direction of the accommodating space from the through hole on the base plate may be opposite to an insertion direction of the free end of the supporting rod into the through hole.

In the key structure according to an embodiment of the invention, any edge of the opening of the thin film circuit assembly is flush with or does not extend over any side edge of the notch.

In the key structure according to an embodiment of the invention, the free end abuts against the edge of the opening which is located at a direction away from the free end and abuts against an inner edge of the through hole of the connecting seat which is located at an end and away from the main body of the base plate.

In the key structure according to an embodiment of the invention, the thin film circuit assembly includes a plurality of film layers, at least one of the plurality of film layers protrudes out relative to other film layers.

In the key structure according to an embodiment of the invention, the plurality of film layers include a first circuit film layer, a second circuit film layer, and an insulation layer, and the insulation layer is disposed between the first circuit film layer and the second circuit film layer.

In the key structure according to an embodiment of the invention, the key structure further includes a buffer layer, and the buffer layer is disposed on the thin film circuit assembly and is close to the edge of the opening, so that the buffer layer is located between the thin film circuit assembly and the lower portion of the free end of the supporting rod.

In the key structure according to an embodiment of the invention, a material of the buffer layer is, for example, polyurethane, epoxy resin, foam, or rubber.

In the key structure according to an embodiment of the invention, the key structure includes a supporting mechanism, and the supporting mechanism is connected between the base plate and the keycap.

In the key structure according to an embodiment of the invention, the key structure includes an elastic contact assembly, and the elastic contact assembly is disposed on the thin film circuit assembly and is located between the thin film circuit assembly and the keycap.

In the key structure according to an embodiment of the invention, the notch may be a recessed/dented part that does not pass through the main body of the base plate to expose a bearing surface.

In the key structure according to an embodiment of the invention, the free end of the supporting rod may be embedded into the notch and abut against an edge of the bearing surface.

According to an embodiment of the invention, a keyboard module includes at least one key structure described above.

BRIEF DESCRIPTION OF THE DRAWINGS

The accompanying drawings are included to provide a further understanding of the invention. The accompanying drawings are incorporated in this specification and constitute a part of this specification. The drawings illustrate embodiments of the invention and, together with the description, serve to explain the principles of the invention.

DESCRIPTION OF THE EMBODIMENTS

Figure 1:
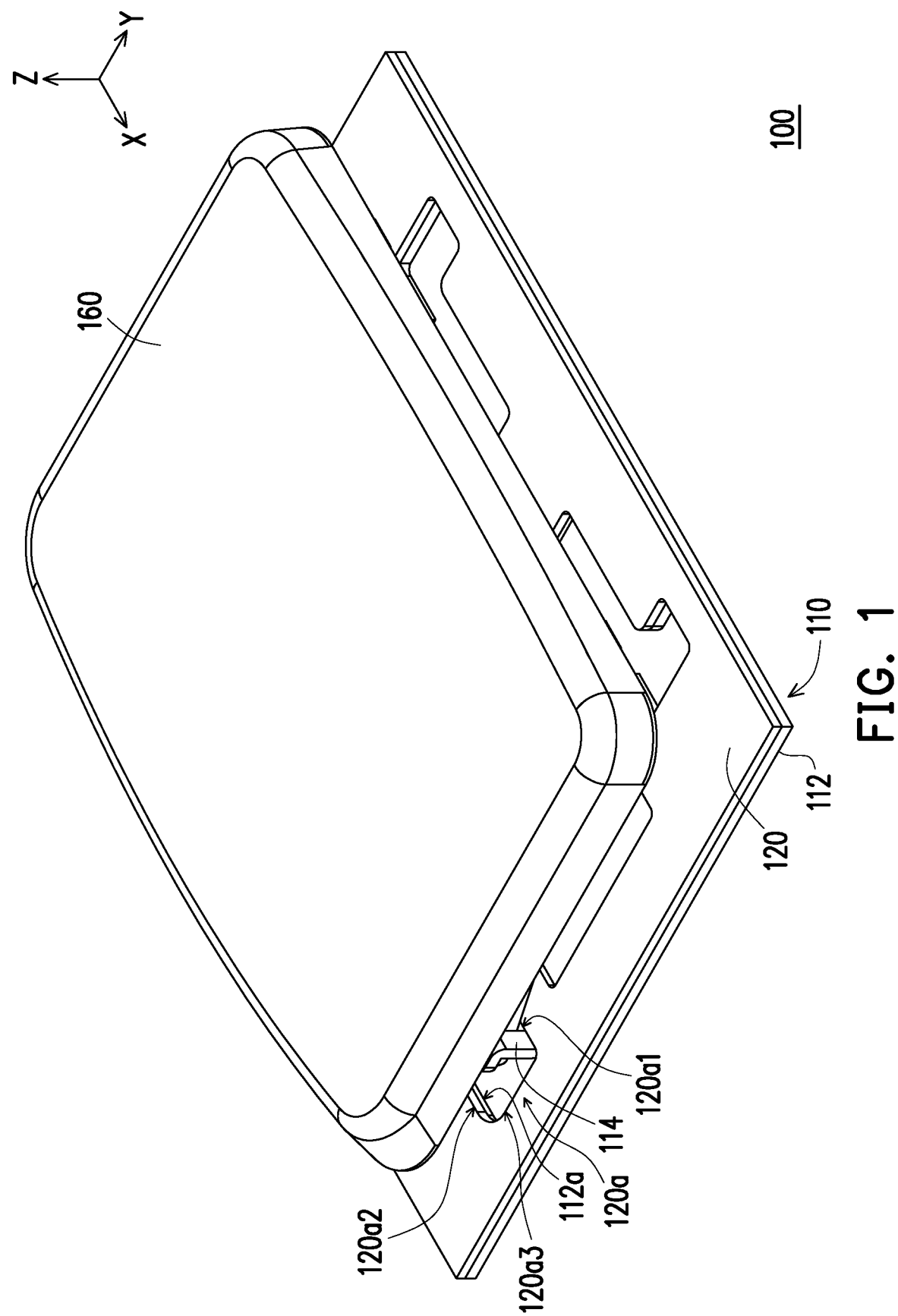
FIG. 1 is a schematic perspective view illustrating a key structure according to an embodiment of the invention.

The invention may be understood with reference to the following detail descriptions and accompanying drawings. It should be noted that in the accompanying drawings, each drawing illustrates general characteristics of methods, structures, and/or materials used by specific embodiments. However, the drawings should not be construed as defining or limiting the scope or property covered by the embodiments. For example, for clarity, the relative size, thickness, and position of each film layer, area and/or structure may be narrowed or enlarged.

The directional terms mentioned in the disclosure, such as "above", "below", "front", "back", "left", and "right", merely refer to directions in the accompanying drawings. Therefore, the directional terms are only used for illustration instead of limiting the invention. It should be learned that when a component or a film layer is referred to as being disposed "on" another component or film layer, the component or the film layer may be directly on the another component or the another film layer, or there is an inserted component or an inserted film layer between the components or the film layers. Oppositely, when a component or a film layer is referred to as being "directly" disposed "on" another component or film layer, there is no inserted component or inserted film layer between the components or the film layers.

In the following embodiments, some or similar reference numerals are used for same or similar components, and the descriptions thereof are omitted. In addition, all characteristics in different embodiments may be used in any combination as long as the characteristics do not violate or collide with the spirit of the invention, and all equivalent variations and modifications made based on the specification or the claims are still encompassed in the scope of the invention. In addition, the terms such as "first" and "second" mentioned in this specification or the claims are only used for naming discrete components or distinguishing different embodiments or scopes, but not used for limiting upper or lower limits of a component quantity, and are not used for limiting a manufacturing sequence or a setting sequence of the components either.

Reference will now be made in detail to exemplary embodiments of the invention, and practices of the exemplary embodiments are illustrated in the accompanying drawings. Whenever possible, same component symbols in the drawings and descriptions are used for indicating same or similar parts.

Figure 2:
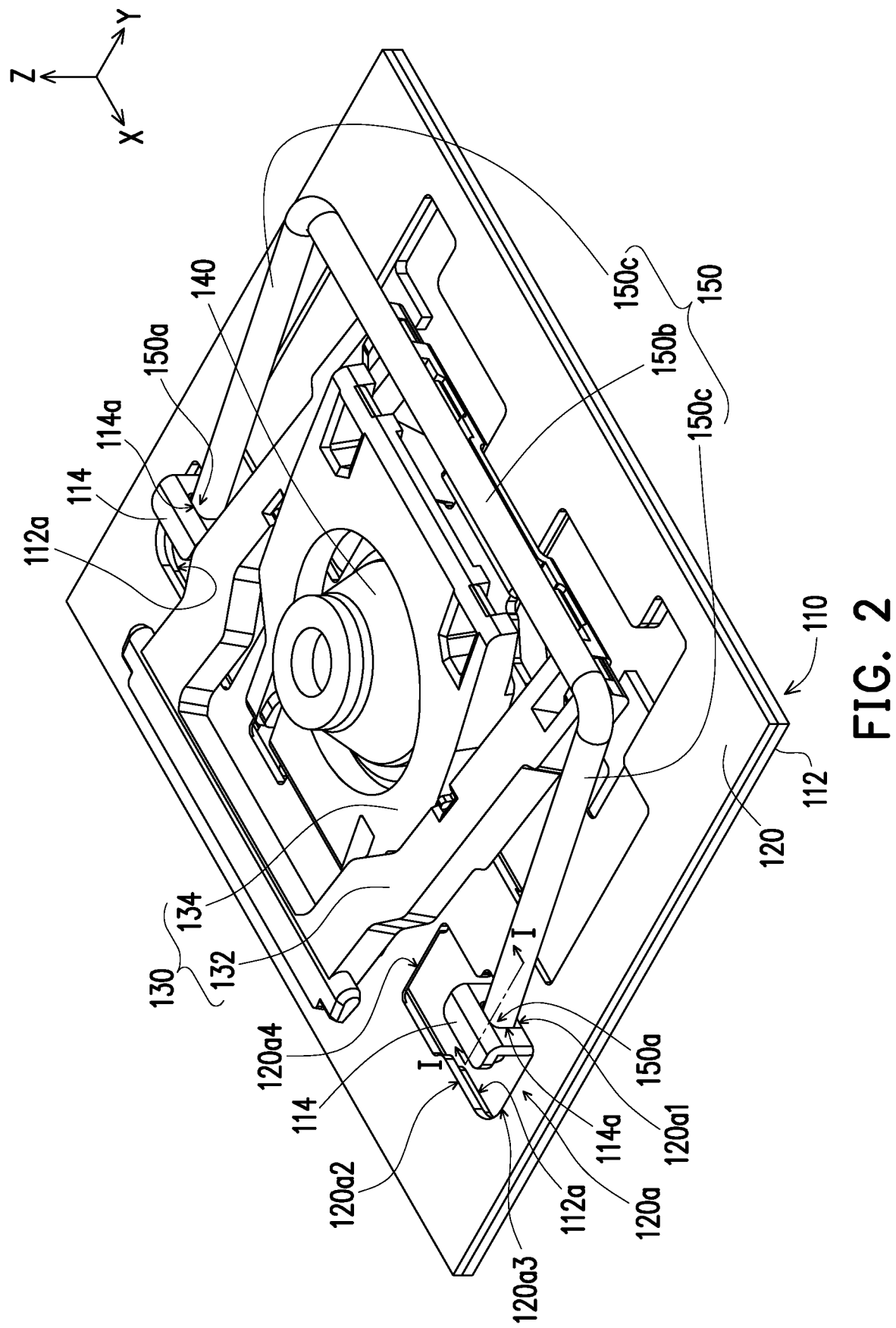
FIG. 2 is a schematic perspective view illustrating some components of the key structure in FIG. 1.

FIG. 1 is a schematic perspective view illustrating a key structure according to an embodiment of the invention. FIG. 2 is a schematic perspective view illustrating the part components of the key structure of FIG. 1. Referring to FIG. 1 and FIG. 2, the key structure 100 of the present embodiment includes a base plate 110, a thin film circuit assembly 120, a supporting mechanism 130, an elastic contact assembly 140, a supporting rod 150, and a keycap 160.

The supporting mechanism 130 is connected between the base plate 110 and the keycap 160, and the keycap 160 is disposed on the base plate 110 in a liftable manner by using the supporting mechanism 130. To be specific, the supporting mechanism 130 of the present embodiment includes a first support unit 132 and a second support unit 134 that are connected each other in a pivotal manner, for example, a scissors structure. Both ends of the first support unit 132 and the second support unit 134 are pivotably coupled to the base plate 110 and the keycap 160 respectively, and the keycap 160 may move up and down with relative pivoting of the first support unit 132 and the second support unit 134. In other embodiments, the keycap 160 may be disposed on the base plate 110 in a liftable manner by using mechanisms in other forms, which is not limited in the invention.

The thin film circuit assembly 120 is disposed on the base plate 110 and is located between the base plate 110 and the keycap 160. Further, the elastic contact assembly 140 may be disposed on the thin film circuit assembly 120 and is located between the thin film circuit assembly 120 and the keycap 160. A user may press the keycap 160, to cause the keycap 160 to move downward to press the elastic contact assembly 140, so that the elastic contact assembly 140 triggers the thin film circuit assembly 120 to generate an input signal. When the user has finished pressing, the user releases the keycap 160. At this moment, the elastic contact assembly 140 may release the elastic potential energy and apply an elastic restoring force to the keycap 160, to drive the keycap 160 to move vertically till the initial position. The elastic contact assembly 140 may be a rubber dome, but is not limited thereto. For example, the elastic contact assembly 140 may also be a metal spring plate. The foregoing designs are selected depending on actual requirements.

In the present embodiment, the base plate 110 includes a main body 112, at least one connecting seat 114 that is disposed on and protrudes from the main body 112 (two connecting seats are shown in FIG. 2), and a plurality of first openings 112a. The connecting seat 114 is substantially perpendicularly disposed relative to the main body 112 and includes a through hole 114a. As shown in FIG. 2, the connecting seat 114 may be integrally connected to the main body 112 and is bent and erected relative to the main body 112. The first opening 112a corresponding to the through hole 114a is communicated with the through hole 114a. In other embodiments, the connecting seat 114 may be disposed on the main body 112 by means of injection molding. Alternatively, the key structure 100 may include two supporting rods 150, and two through holes 114a may be formed in each connecting seat 114. In other words, any embodiment, in which the key structure 100 includes one or more supporting rods 150 and one or more through holes 114a are formed in the connecting seat 114, falls within the spirit and scope of the invention. In addition, the connecting seat 114 may have different shapes and structures depending on actual design requirements. Therefore, the shape, structure, and quantity of the connecting seats 114 are not limited to the drawings of the present embodiment.

As shown in FIG. 2, the supporting rod 150 includes a middle rod body 150b and two side rod bodies 150c that perpendicularly extend from two sides of the middle rod body 150b. The middle rod body 150b is pivotally connected to an inner wall of the keycap 160. Free ends 150a (two free ends 150a are shown in FIG. 2) of the two side rod bodies 150c respectively are inserted into the through holes 114a of the connecting seats 114 and extend to the first openings 112a (for example, a first direction D1 shown in FIG. 5A), so that the keycap 160 may stably and smoothly move up and down relative to the main body 112. In the lifting process of the keycap 160, the supporting rod 150 is driven by the keycap 160 to move up and down with the free end 150a as a pivot center.

Figure 3A:
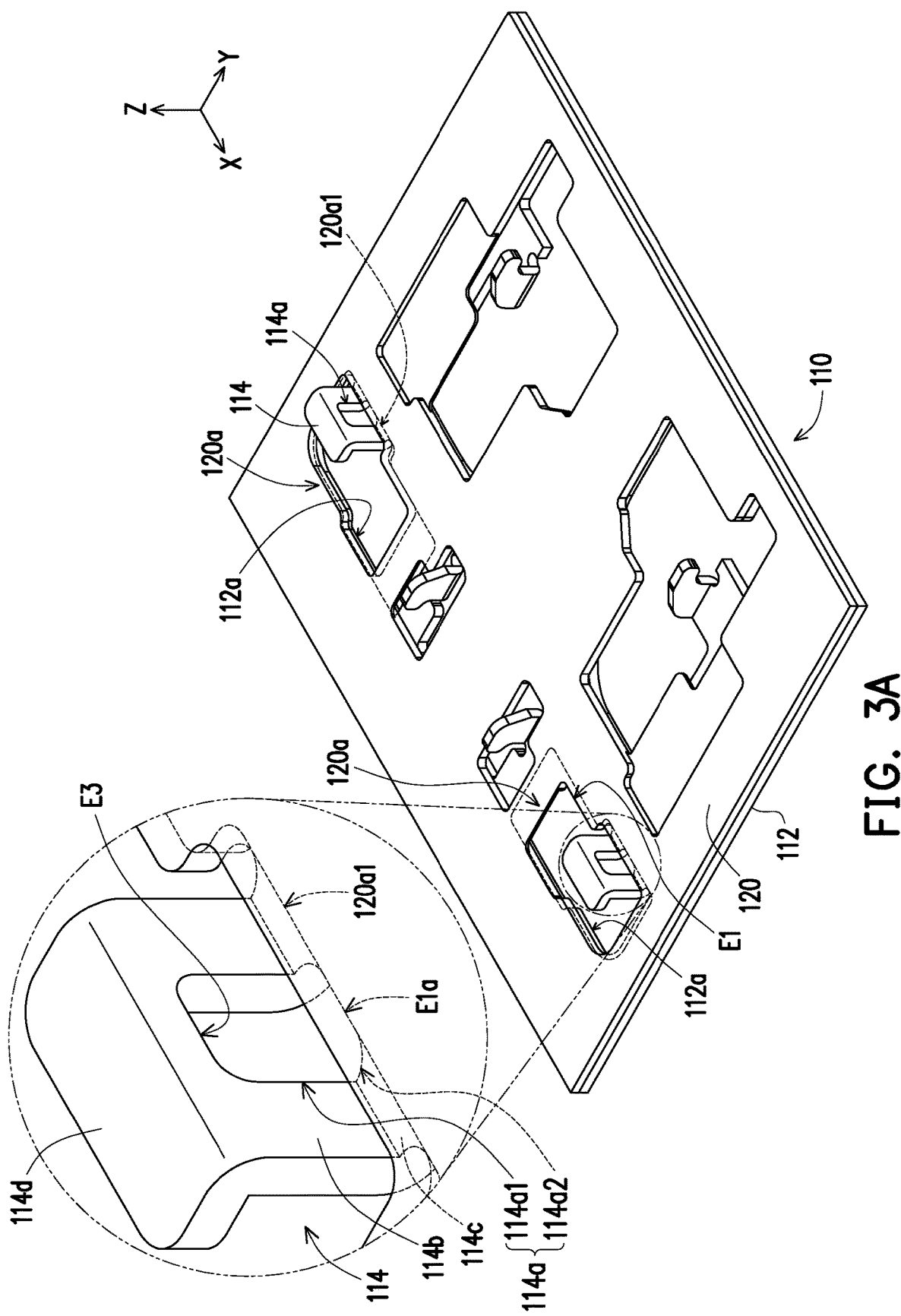
FIG. 3A is a schematic perspective view illustrating a base plate and a thin film circuit assembly according to an embodiment of the invention.
Figure 4A:
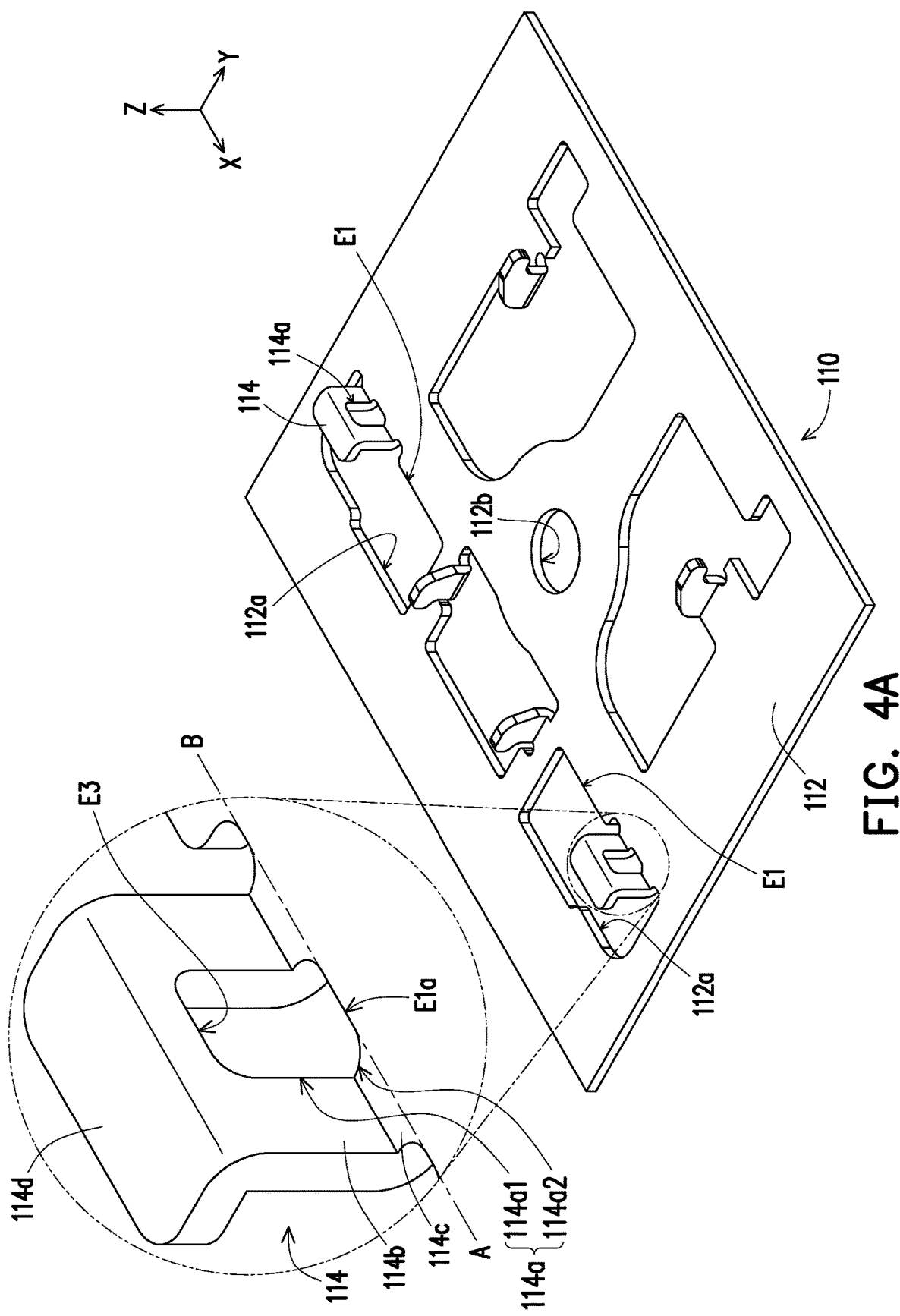
FIG. 4A is a schematic perspective view illustrating the base plate in FIG. 3A.

FIG. 3A is a schematic perspective view illustrating a base plate and a thin film circuit assembly according to an embodiment of the invention. FIG. 4A is a schematic perspective view illustrating the base plate in FIG. 3A. As shown in FIG. 3A and FIG. 4A, the connecting seat 114 includes a pivot plate 114b and a connecting plate 114c. The pivot plate 114b is substantially perpendicular to the main body 112, and the connecting plate 114c is respectively connected to one side of the pivot plate 114b and a side edge E1 of the main body 112, wherein one side of the connecting plate 114c is connected to the side edge E1 of the main body 112 to form a boundary line AB. In the present embodiment, the pivot plate 114b is substantially perpendicular to the connecting plate 114c, and may further include an extending plate 114d that extends on another side of the pivot plate 114b. The extending plate 114d may be substantially perpendicular to the pivot plate 114b, that is, the extending plate 114d may be parallel to the connecting plate 114c in an opposite direction. In the present embodiment, the through hole 114a is formed in the pivot plate 114b and extends to the connecting plate 114c. Furthermore, the through hole 114a includes a first notch 114a1 formed in the pivot plate 114b and a second notch 114a2 formed in the connecting plate 114c. The second notch 114a2 is like a concave part, which forms an accommodating space S with the corresponding side edge E1 (shown in FIG. 4A) of the main body 112. A local section E1a, which is adjacent to the through hole 114a and faces towards a direction away from the free end 150a (namely, a direction Y), of the side edge E1 of the main body 112 is located in an end, which is away from the first notch 114a1, of the second notch 114a2 and aligns with the first notch 114a1.

Figure 3B:
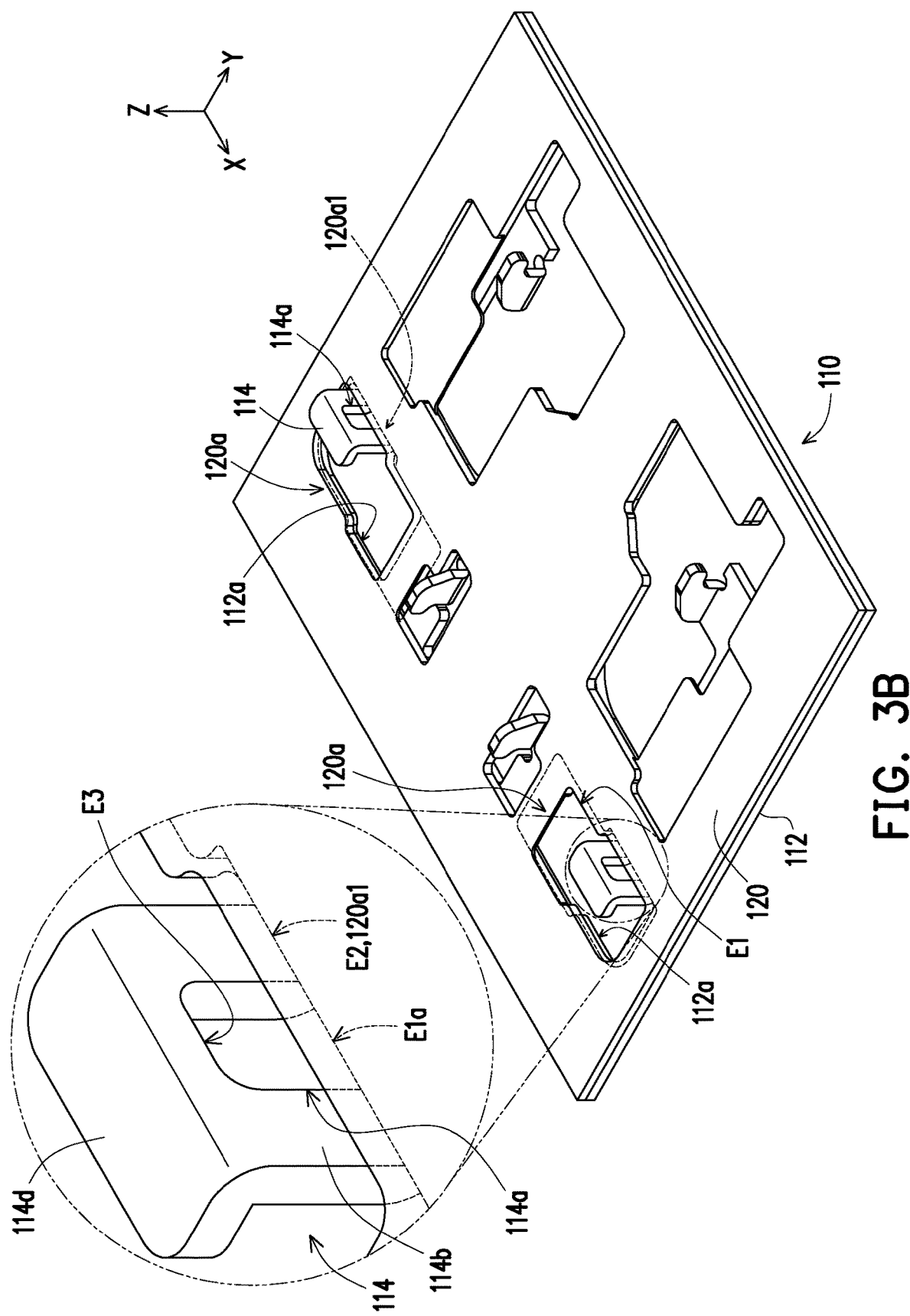
FIG. 3B is a schematic perspective view illustrating a base plate and a thin film circuit assembly according to another embodiment of the invention.
Figure 4B:
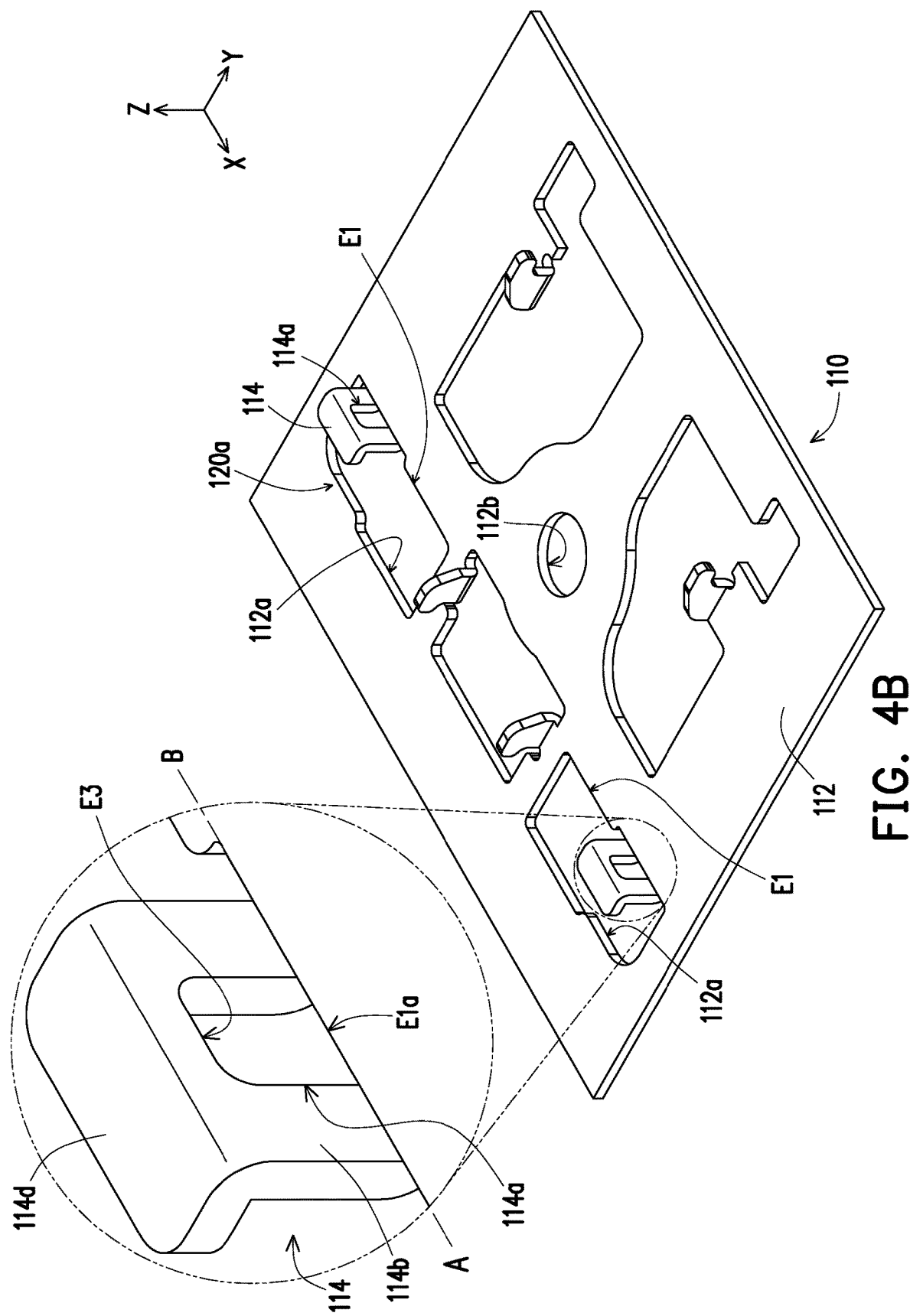
FIG. 4B is a schematic perspective view illustrating the base plate in FIG. 3B.

In actual application, the pivot plate 114b, the connecting plate 114c, and the extending plate 114d may be integrally formed by means of punch forming. In another embodiment, the connecting seat 114 may omit the connecting plate 114c. As shown in FIG. 3B and FIG. 4B, one side of the pivot plate 114b is connected to the side edge E1 of the main body 112 to form the boundary line AB. In other words, the pivot plate 114b of the connecting seat 114 in the invention is directly connected to the side edge E1 of the main body 112 in a substantially perpendicular manner. Similarly, the extending plate 114d may also be a structure that can be omitted, so as to simplify a manufacturing process of the connecting seat 114. In addition, in the present embodiment, as shown in FIG. 4A, the main body 112 is further provided with a hole 112b relative to the elastic contact assembly 140.

Figure 6:
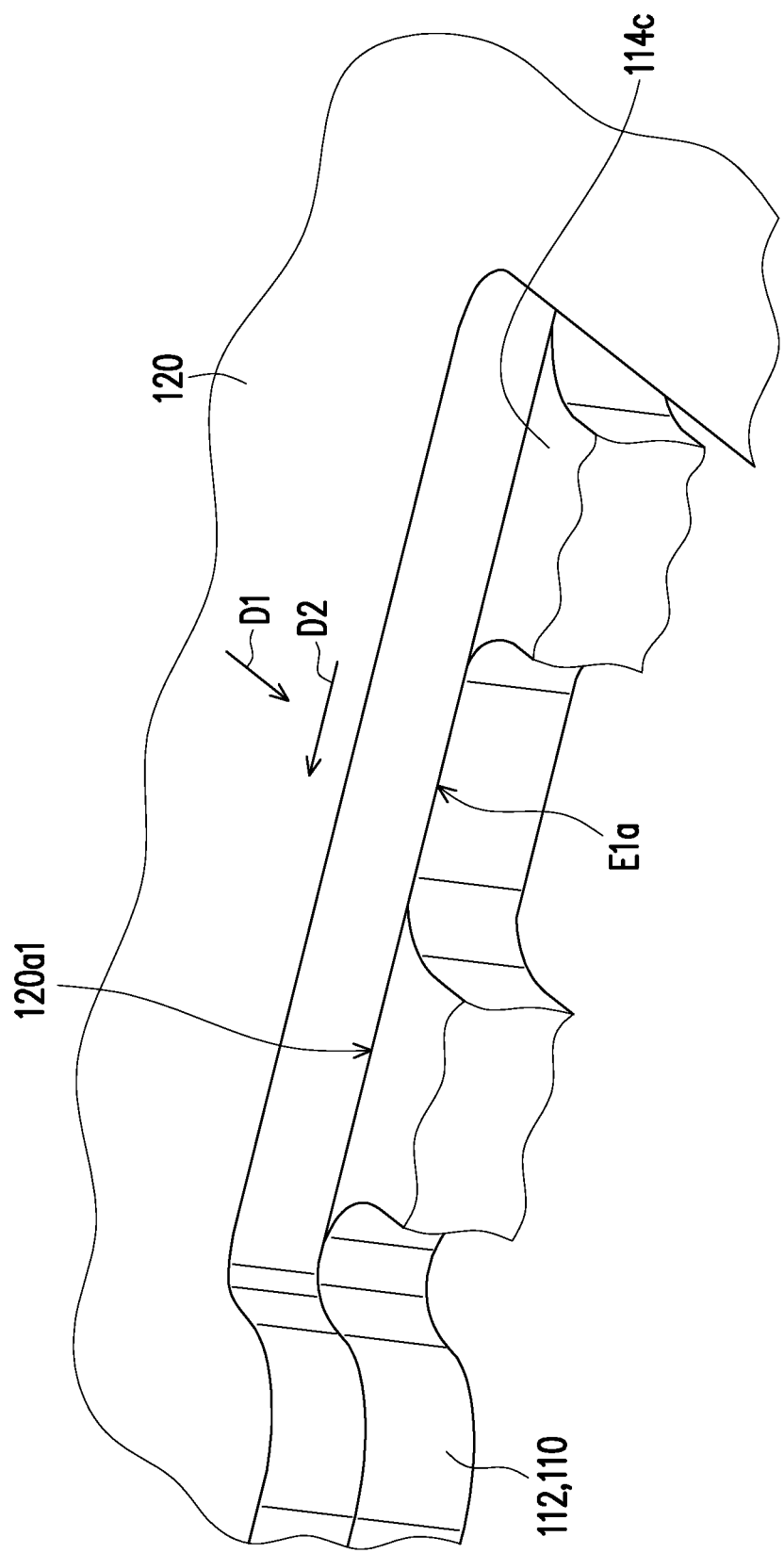
FIG. 6 is a partial, enlarged top view of the base plate and the thin film circuit assembly in FIG. 3A from another perspective.

Besides, the thin film circuit assembly 120 is disposed on the main body 112. Specifically, the thin film circuit assembly 120 includes a plurality of second openings 120a, which at least corresponds to the connecting seats 114, to allow the connecting seats 114 to protrude out from the second openings 120a. As shown in FIG. 2, each second opening 120a includes a first and a second side edges 120a1, 120a2 that are opposite to each other and a third and a fourth side edges 120a3, 120a4 that are opposite to each other. The first side edge 120a1 is connected between the one end of the third and fourth side edges 120a3, 120a4, and the second side edge 120a2 is connected between the other end of the third and fourth side edges 120a3, 120a4. In the present embodiment, as shown in FIG. 3A and FIG. 6, any part of the thin film circuit assembly 120 does not overlap a vertical projection region of the second notch 114a2 located in the connecting plate 114c. In other words, the thin film circuit assembly 120 does not extend to cover the second notch 114a2 (namely, the concave part) of the connecting plate 114c.

In the present embodiment, as shown in FIG. 3A, the first side edge 120a1 of the second opening 120a of the thin film circuit assembly 120 is flush with or does not extend over the boundary line AB, so that the thin film circuit assembly 120 does not cover any part of the second notch 114a2 of the connecting plate 114c. Similarly, in the embodiment shown in FIG. 3B and FIG. 4B, the first side edge 120a1 of the second opening 120a of the thin film circuit assembly 120 is also substantially flush with or does not extend over the boundary line AB. In other embodiments, the first, third and fourth side edges 120a1, 120a3, and 120a4 of the second opening 120a of the thin film circuit assembly 120 do not extend to cover any part of the second notch 114a2 of the connecting plate 114c.

Figure 3C:
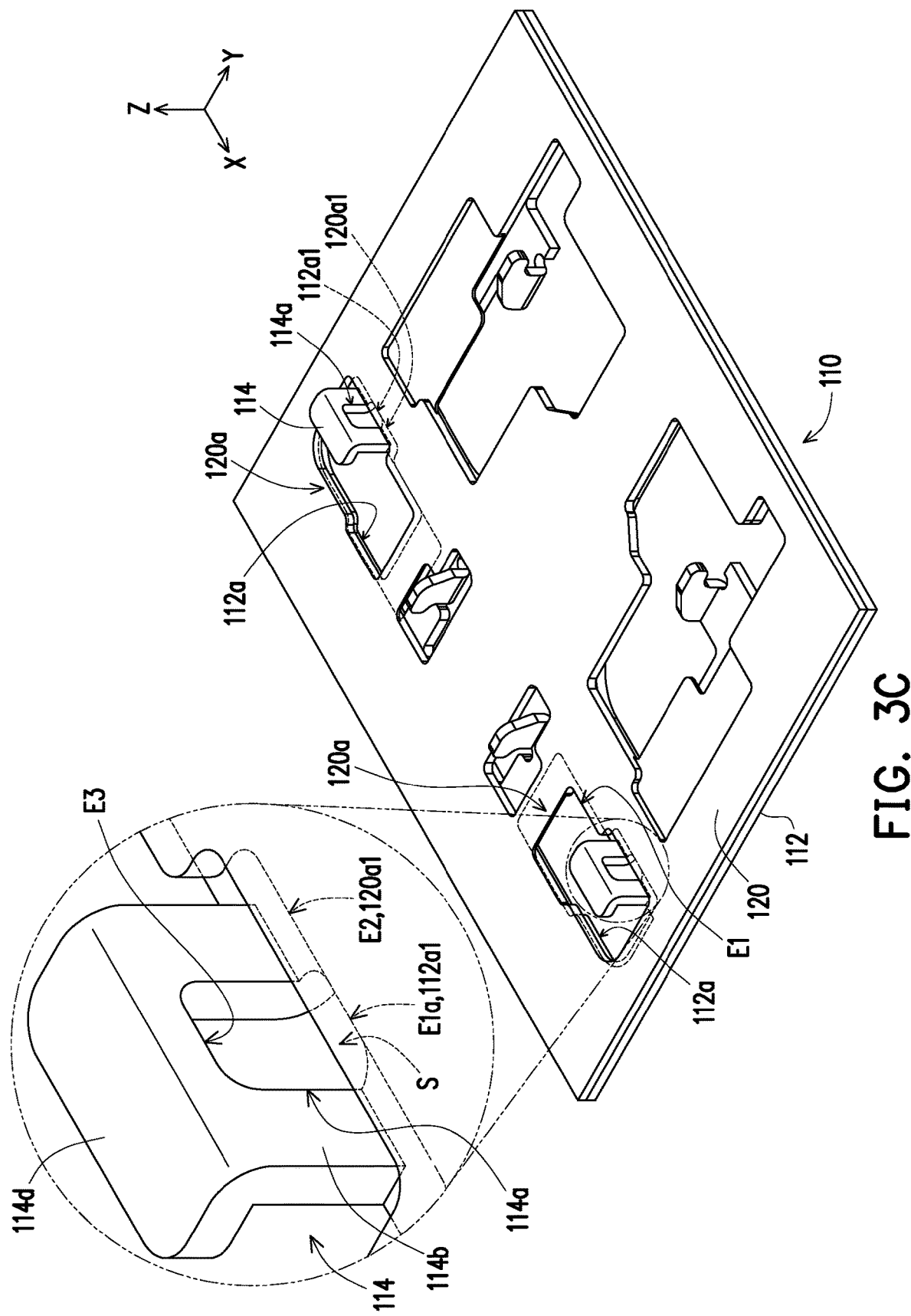
FIG. 3C is a schematic perspective view illustrating a base plate and a thin film circuit assembly according to another embodiment of the invention.
Figure 4C:
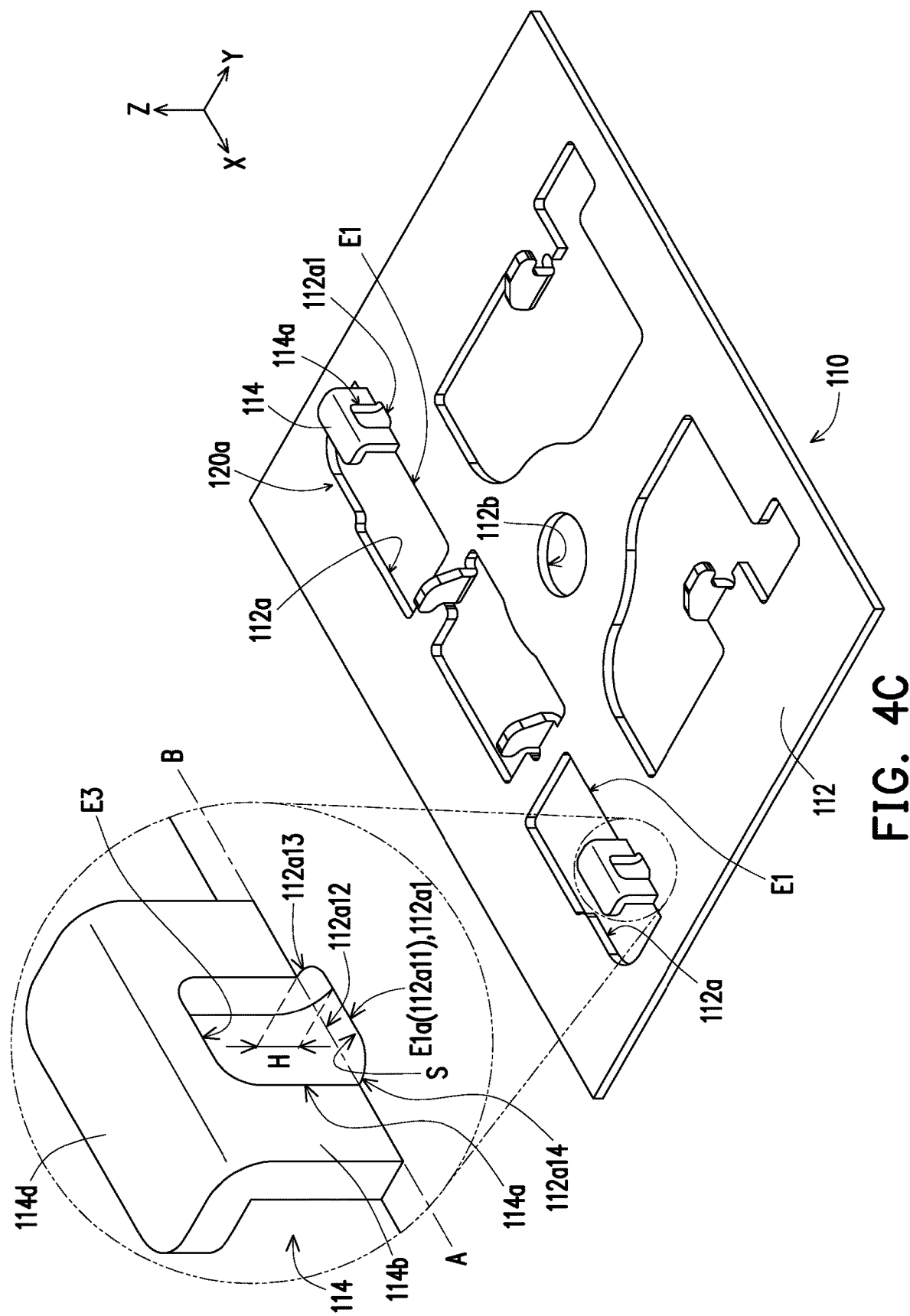
FIG. 4C is a schematic perspective view illustrating the base plate in FIG. 3C.

In addition, in the embodiment shown in FIG. 3C and FIG. 4C, the main body 112 of the key structure 100 also includes at least one third notch 112a1 that is formed in the main body 112 and extends towards the direction far away from the free end 150a (namely, the direction Y). Moreover, the third notch 112a1 is communicated with the through hole 114a and the first opening 112a. Two third notches 112a1 are shown in FIG. 3C and FIG. 4C, but are not limited thereto. Referring to FIG. 4C, specifically, the third notch 112a1 includes a first and a second edges 112a11, 112a12 which are opposite to each other and a third and a fourth edges 112a13, 112a14 which are opposite to each other. The first edge 112a11 is a local section E1a, which is adjacent to the through hole 114a and faces towards the direction away from the free end 150a (namely, the direction Y), of the side edge E1 of the main body 112 (shown in FIG. 4C). The local section E1a is located at an end, which is away from the through hole 114a, of the third notch 112a1, and aligns with the through hole 114a. The first edge 112a11 is connected between the third and fourth edges 112a13, 112a14, and the second edge 112a12 is connected between the third and fourth edges 112a13, 112a14. In the present embodiment, the third notch 112a1 forms an accommodating space S with the corresponding side edge E1 of the main body 112 (shown in FIG. 4C). The accommodating space S extends from the through hole 114a and is communicated with the through hole 114a. An extending direction of the accommodating space S from the through hole 114a on the main body 112 is opposite to an insertion direction of the free end 150a of the supporting rod 150 into the through hole 114a.

In the present embodiment, a vertical projection area of the third notch 112a1 on the base plate 110 is smaller than or equal to that of the second opening 120a of the thin film circuit assembly 120 on the base plate 110. That is, a vertical projection region of the third notch 112a1 on the base plate 110 is completely located within a vertical projection region of the second opening 120a of the thin film circuit assembly 120 on the base plate 110. Specifically, any part of the thin film circuit assembly 120 does not extend to cover the third notch 112a1 in the base plate 110. In the present embodiment, any side edge (120a1, 120a2, 120a3, and 120a4) of the second opening 120a of the thin film circuit assembly 120 is flush with or does not extend over any edge (112a11, 112a12, 112a13, and 112a14) of the third notch 112a1, so that the thin film circuit assembly 120 does not extend to cover the third notch 112a1. In other words, any part of the thin film circuit assembly 120 does not overlap a vertical projection region of the third notch 112a1.

In the embodiment shown in FIG. 3C and FIG. 4C, the third notch 112a1 may be a through hole that penetrates through the main body 112, and a gap H (shown in FIG. 4C) exists between a bottom surface and a top surface of the main body 112 are, to form the accommodating space S. In the embodiment shown in FIG. 3D and FIG. 4D, the third notch 112a1 may be a recessed/dented part that does not pass through the main body 112 to expose a bearing surface 112a2 (as a bottom surface of the third notch 112a1). A gap H' (shown in FIG. 4D) exists between the bottom surface of the third notch 112a1 and the top surface of the main body 112, to define an accommodating space S'. Similarly, as shown in FIG. 3D, any part of the thin film circuit assembly 120 does not overlap a vertical projection region of the third notch 112a1.

Figure 3D:
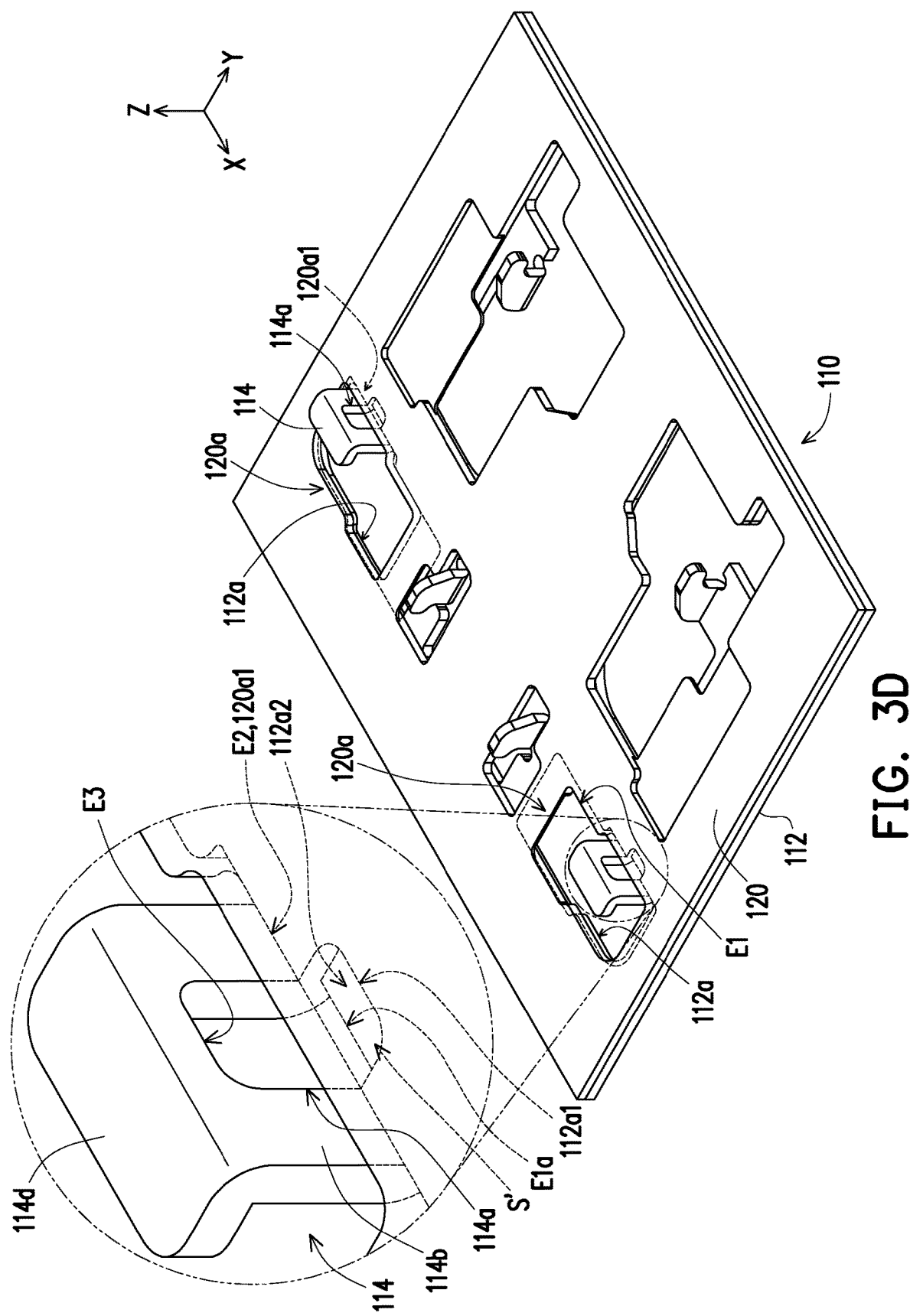
FIG. 3D is a schematic perspective view illustrating a base plate and a thin film circuit assembly according to another embodiment of the invention.
Figure 3E:
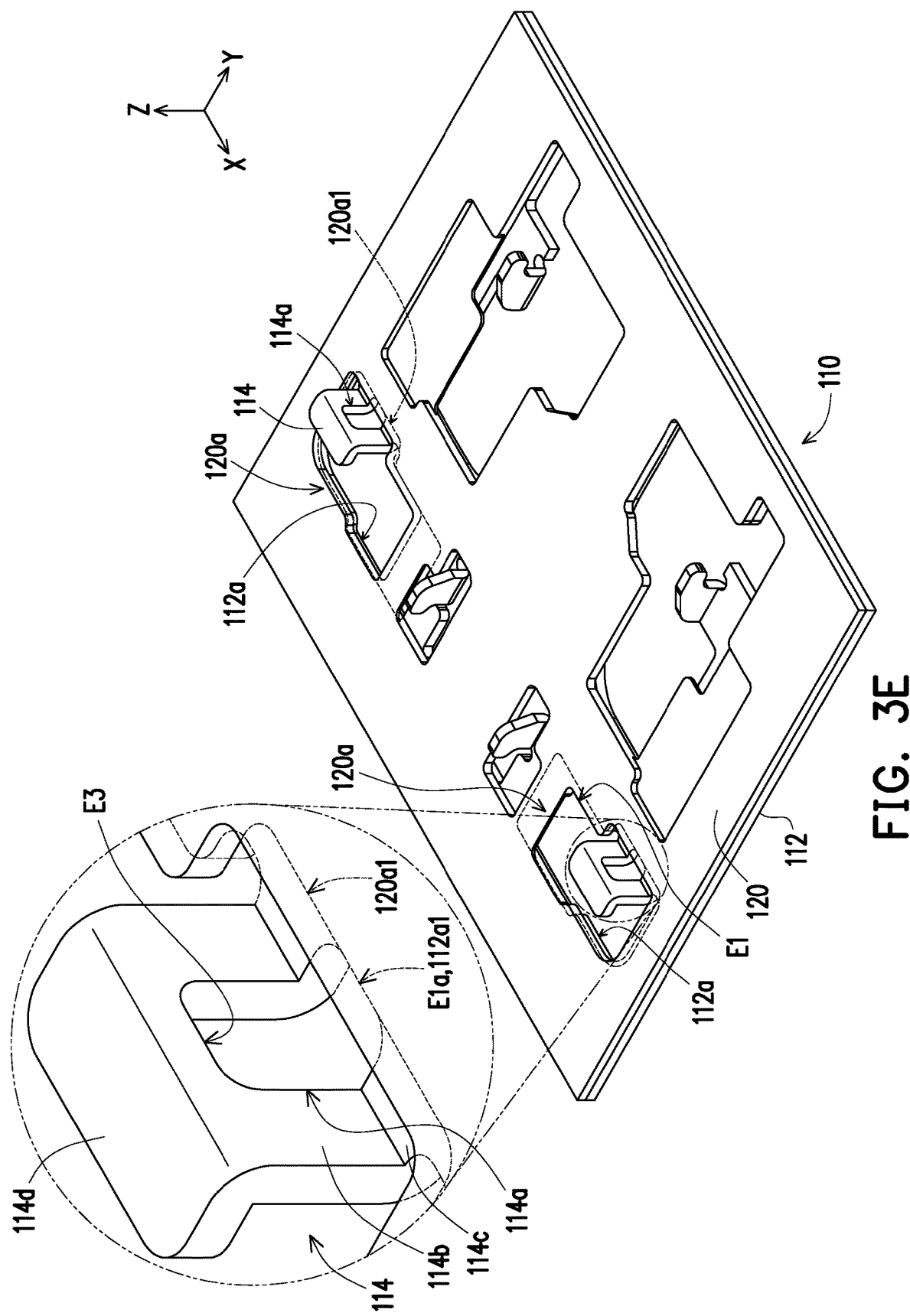
FIG. 3E is a schematic perspective view illustrating a base plate and a thin film circuit assembly according to another embodiment of the invention.
Figure 4D:
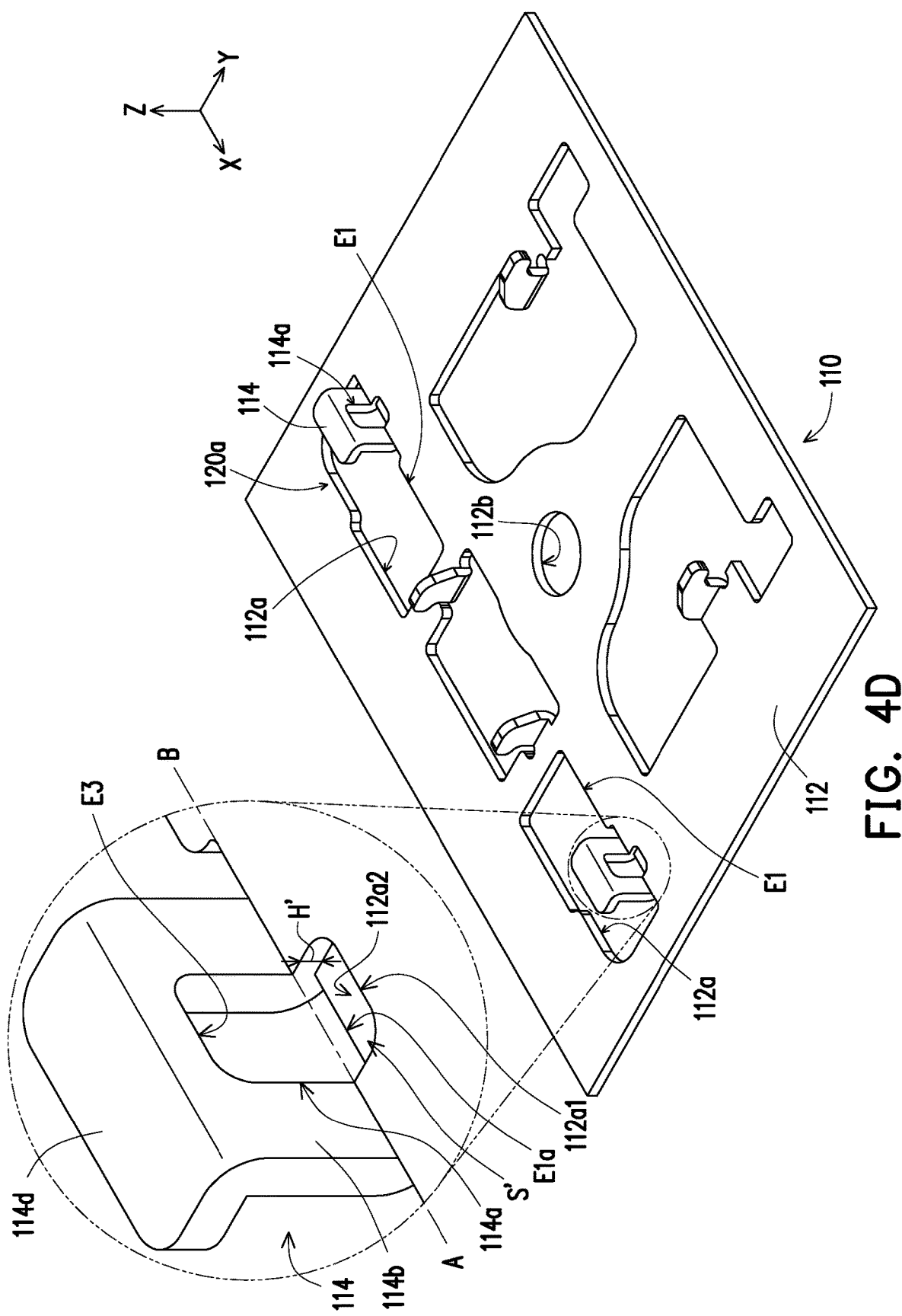
FIG. 4D is a schematic perspective view illustrating the base plate in FIG. 3D.
Figure 4E:
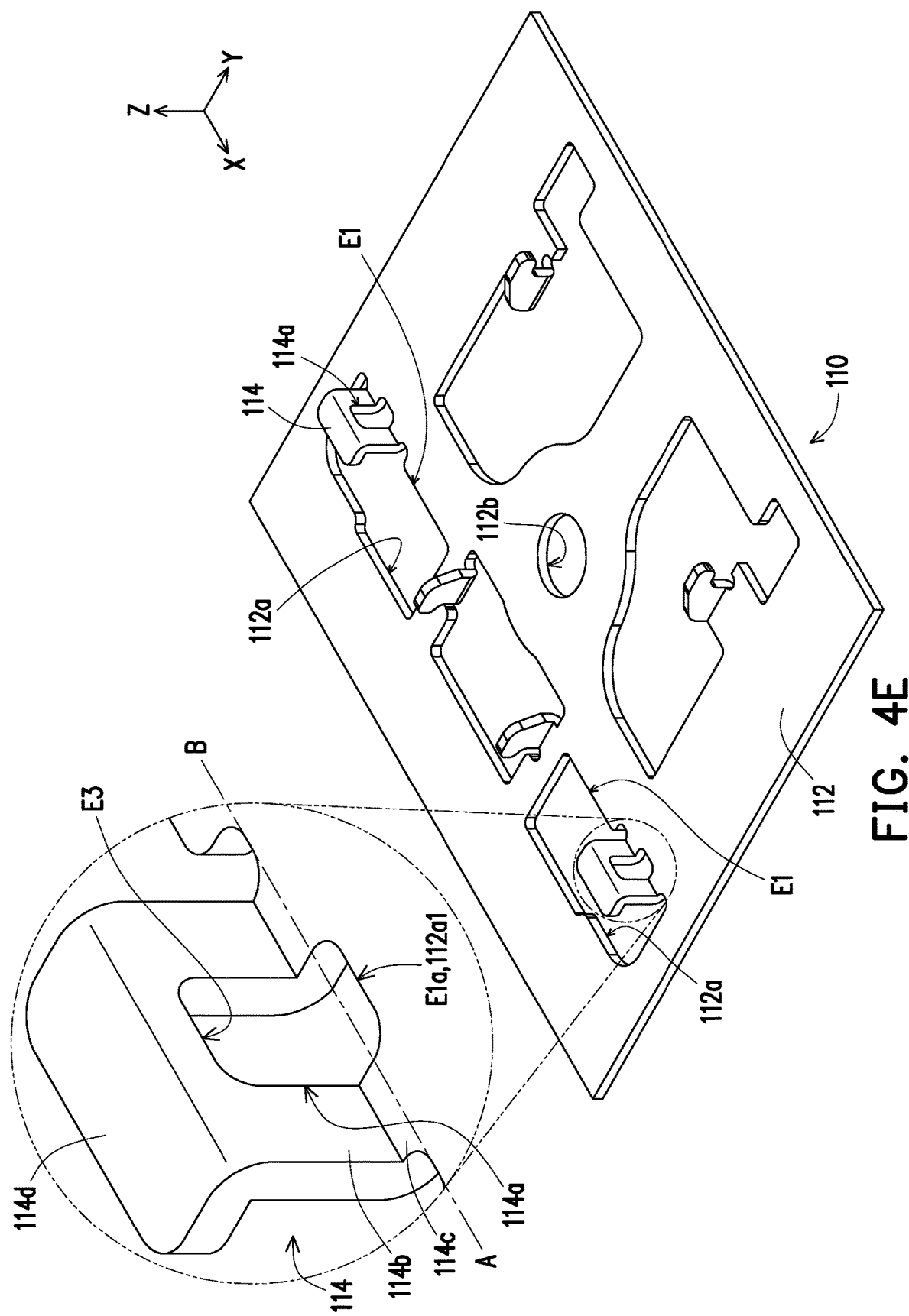
FIG. 4E is a schematic perspective view illustrating the base plate in FIG. 3E.

In the embodiment shown in FIG. 3E and FIG. 4E, the connecting seat 114 includes the connecting plate 114c, and the third notch 112a1 is also formed in the main body 112. The foregoing design of the third notch 112a1 shown in FIG. 3C and FIG. 3D may be applied to the embodiment of FIG. 3E and FIG. 4E, which is not limited in the invention. In addition, in other applications, the third notch 112a1 may alternatively be an extension of the second notch 114a2 of the connection plate 114c on the main body 112.

According to the foregoing embodiment of the invention, when the free end 150a of the supporting rod 150 is slidably inserted into the through hole 114a of the connecting seat 114, the design of the third notch 112a1 may reduce the height of the connecting seat 114, and does not affect a swing of the free end 150a of the supporting rod 150, so as to meet a requirement of thinning the key structure 100.

Moreover, referring to FIG. 3D and FIG. 4D, the third notch 112a1 may be the recessed/dented part that does not penetrate through the main body 112. Therefore, when the free end 150a of the supporting rod 150 is slidably arranged in the through hole 114a of the connecting seat 114, the height of the connecting seat 114 may be slightly reduced, and in addition, the lower portion of the free end 150a of the supporting rod 150 abuts against the first side edge 120a1 of the second opening 120a of the thin film circuit assembly 120 and the free end 150a of the supporting rod 150 may be slightly embedded into the third notch 112a1. In this way, regardless of the size of the third notch 112a1, the bearing surface 112a2 and the through hole 114a cooperate with each other to prevent the free end 150a of the supporting rod 150 from turning over because the free end 150a may abut against an edge of the bearing surface 112a2, so that the free end 150a of the supporting rod 150 can move stably in the through hole 114a.

Figure 5A:
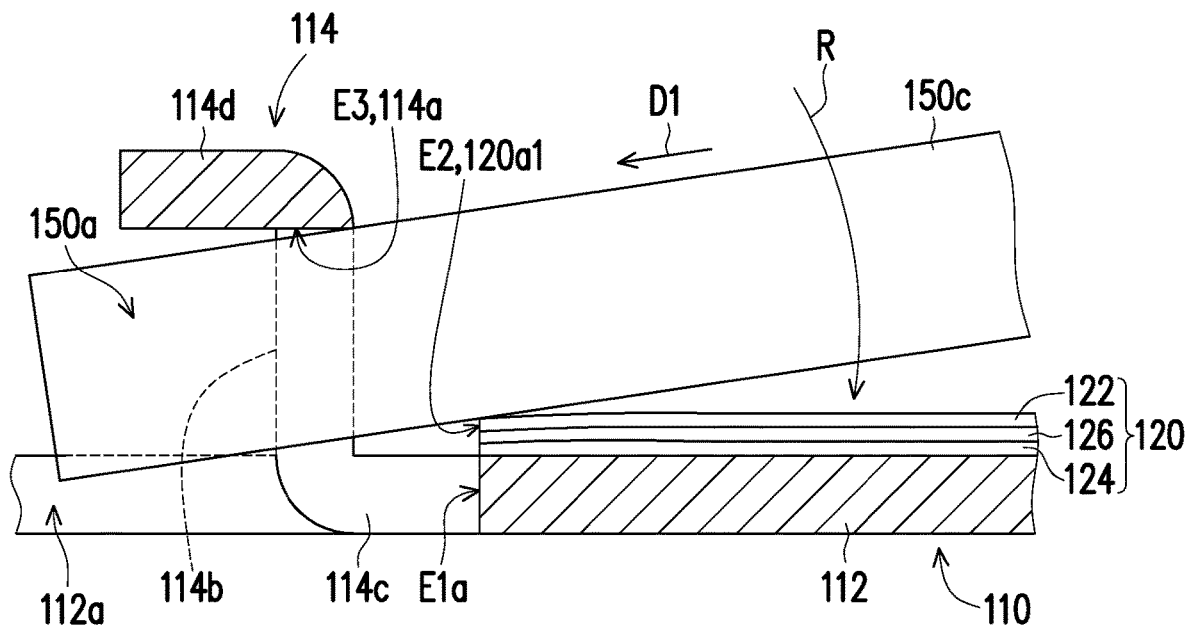
FIG. 5A is a schematic cross-sectional view of some components of a key structure taken along a section line I-I in FIG. 2.
Figure 5B:
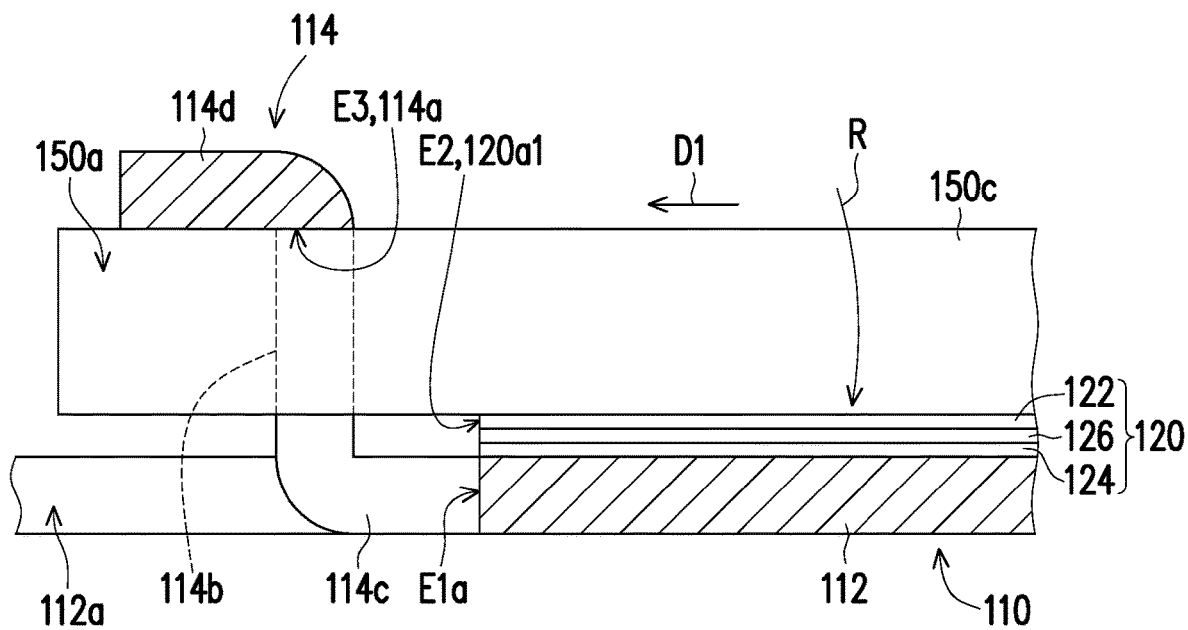
FIG. 5B is a diagram illustrating an operation status of a supporting rod in FIG. 5A.

To help understand a corresponding operation relationship between the free end 150a of the supporting rod 150 and the connecting seat 114 as well as the thin film circuit assembly 120 when the keycap 160 moves up and down, the following uses FIG. 5A and FIG. 5B as an example for description. However, it should be understood that the principle may be similarly used and applied to any embodiment of FIG. 3B to FIG. 3E, but should not be understood as a limitation on the invention.

FIG. 5A is a schematic cross-sectional view of some components of the key structure in FIG. 2, and corresponds to a line I-I in FIG. 2. Referring to FIG. 2 and FIG. 5A, the thin film circuit assembly 120 is located between the supporting rod 150 and the main body 112. Therefore, when the free end 150a of the supporting rod 150 is slidably inserted into the through hole 114a of the connecting seat 114, the free end 150a of the supporting rod 150 abuts against the first side edge 120a1 of the second opening 120a of the thin film circuit assembly 120 just therebelow, so that the free end 150a of the supporting rod 150 does not knock on the main body 112 when moving up and down, thereby avoiding noise.

The following describes a detailed structure of the thin film circuit assembly 120 of the present embodiment. Referring to FIG. 5A, in the present embodiment, the thin film circuit assembly 120 is a multi-layered structure, which includes a plurality of film layers that are stacked in order. Specifically, the plurality of film layers includes a first circuit film layer 122, a second circuit film layer 124, and an insulation layer 126. The insulation layer 126 is disposed between the first circuit film layer 122 and the second circuit film layer 124. In this embodiment, each of the first circuit film layer 122, the second circuit film layer 124, and the insulation layer 126 is made from relatively elastic, flexible polymeric materials, for example, a PET (polyethylene terephthalate) material.

To be specific, as shown in FIG. 5B, when the keycap 160 is pressed down towards the base plate 110, the middle rod body 150b of the supporting rod 150 may move down with the keycap 160 (swing along a rotation direction R shown in FIG. 5A), and the free end 150a of the supporting rod 150 may swing up in the through hole 114a of the connecting seat 114. Next, when the keycap 160 is released (an initial state shown in FIG. 5A), the keycap 160 and the middle rod body 150b of the supporting rod 150 may bounce immediately (due to the elastic restoring force provided by the elastic contact assembly 140), and the free end 150a of the supporting rod 150 may swing downwards rapidly in the through hole 114a of the connecting seat 114. The thin film circuit assembly 120 may provide the effect of buffering for the free end 150a of the supporting rod 150, and does not affect the swing of the free end 150a of the supporting rod 150. As described above, the first side edge 120a1 of the second opening 120a of the thin film circuit assembly 120 abuts against the lower portion of the free end 150a of the supporting rod 150. Therefore, when the free end 150a of the supporting rod 150 swings downwards rapidly in the through hole 114a of the connecting seat 114, the free end 150a may press the thin film circuit assembly 120 (as shown in FIG. 5A, the thin film circuit assembly may be pressed by the supporting rod 150 and slightly deformed). That is, by means of buffering and resistance provided by the first side edge 120a1 of the second opening 120a of the thin film circuit assembly 120, the free end 150a of the supporting rod 150 does not directly strike the base plate 110, thereby avoiding striking noise. Therefore, comfort of the key structure 100 in use may be improved.

FIG. 6 is a partial, enlarged top view of the base plate and the thin film circuit assembly in FIG. 3A from another perspective. Referring to FIG. 5A to FIG. 6, to avoid abnormal sound produced when the free end 150a of the supporting rod 150 strikes the main body 112, the first side edge 120a1 of the second opening 120a of the thin film circuit assembly 120 (with a side edge E2) is designed as the local section E1a that is flush with the side edge E1 of the first opening 112a, so that in the local section E1a, the thin film circuit assembly 120 is completely blocked between the supporting rod 150 and the base plate 110, ensuring that the free end 150a of the supporting rod 150 does not touch the main body 112. Therefore, the abnormal sound produced when the free end 150a of the supporting rod 150 strikes the main body 112 is avoided.

The following describes a specific connection relationship between the supporting rod 150 and the base plate 110. The through hole 114a of the connecting seat 114 includes a side edge E3, and the side edge E3 is located at an end, which is away from the base plate 110, of the through hole 114a. In addition, the free end 150a of the supporting rod 150 of the present embodiment is inserted into the through hole 114a along with a first direction D1 (marked in FIG. 5A to FIG. 6). The local section E1a of the side edge E1 of the first opening 112a, the first side edge 120a1 of the second opening 120a, and the side edge E3 of the through hole 114a extend along with a second direction D2 (marked in FIG. 6). The first direction D1 and the second direction D2 are substantially perpendicular to each other. In the present embodiment, the lower portion of the free end 150a of the supporting rod 150 abuts against an edge (the first side edge 120a1) of the second opening 120a of the thin film circuit assembly 120. In another embodiment, an upper portion of the free end 150a of the supporting rod 150 may abut against the side edge E3 of the through hole 114a of the connecting seat 114. In addition to avoiding the abnormal sound produced when the free end 150a of the supporting rod 150 strikes the main body 112 or strikes the connecting seat 114, the design is also conducive to overall thinning of the key structure 100.

Furthermore, to allow the thin film circuit assembly 120 to have a better deformation space without affecting the swing of the free end 150a of the supporting rod 150, at least one of the plurality of film layers is configured to protrude relative to other film layers but is flush with or does not extend over the corresponding first edge 112a11 of the third notch 112a1, to form the side edge E2 of the second opening 120a of the thin film circuit assembly 120. In actual application, an angle of inclination of the supporting rod 150 and a distance between the supporting rod 150 and the base plate 110 may be used to determine which of the plurality of film layers protrudes to form the side edge E2 of the second opening 120a of the thin film circuit assembly 120. Further description will be made with reference to FIGS. 7-10.

Figure 7:
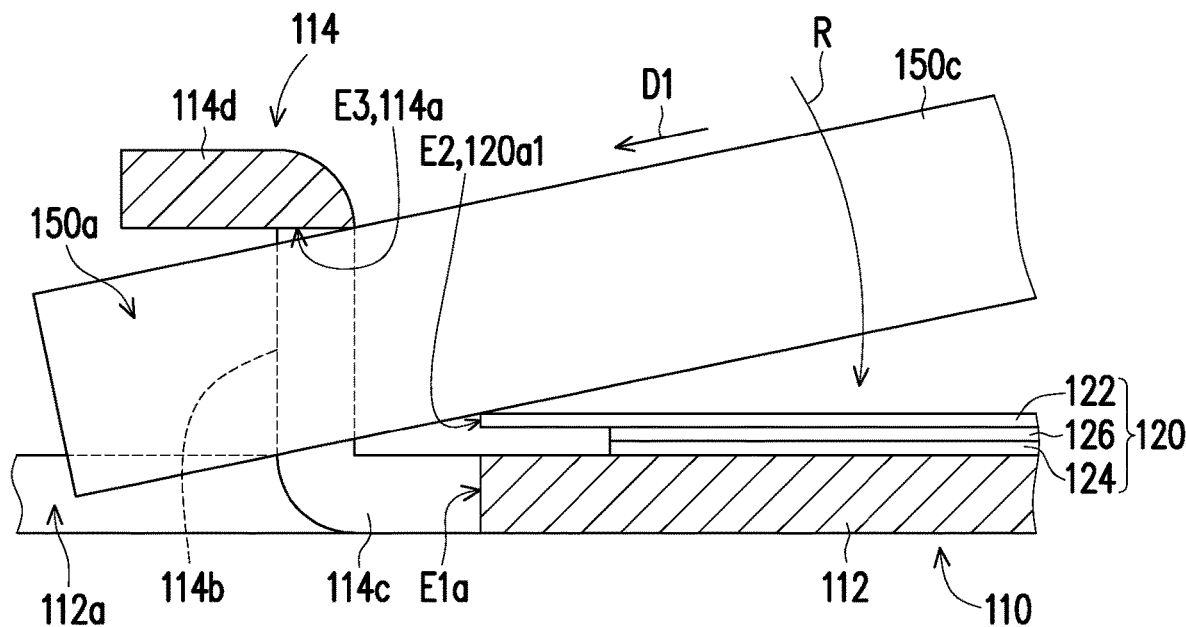
FIG. 7 is a schematic cross-sectional view of some components of a key structure according to another embodiment of the invention.
Figure 8:
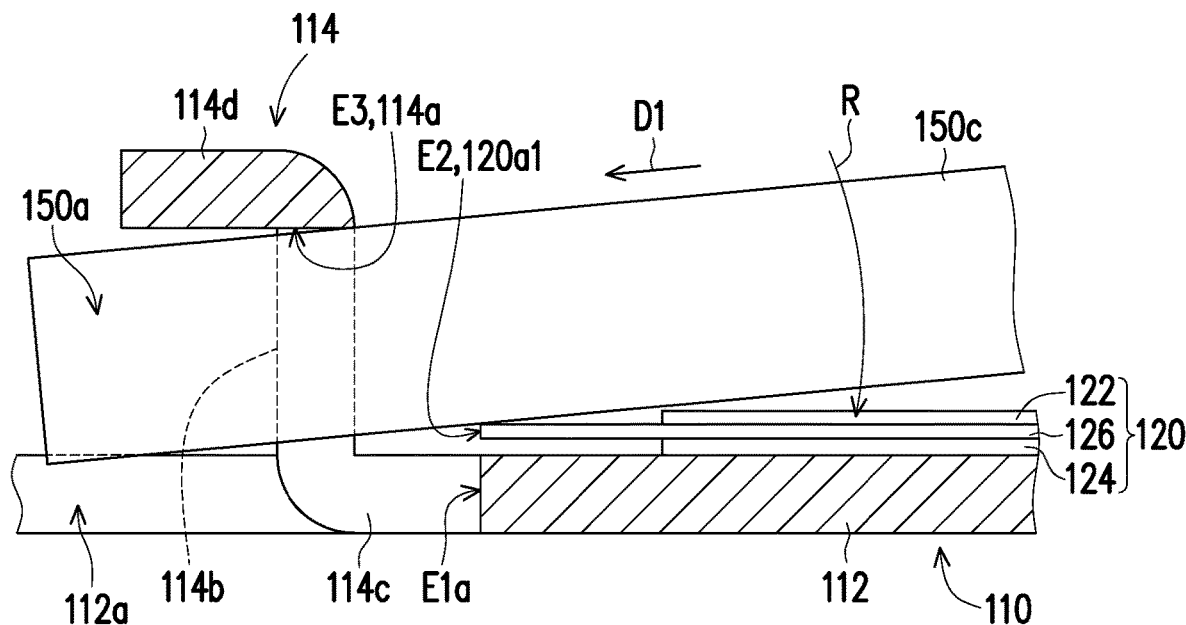
FIG. 8 is a schematic cross-sectional view of some components of a key structure according to another embodiment of the invention.
Figure 9:
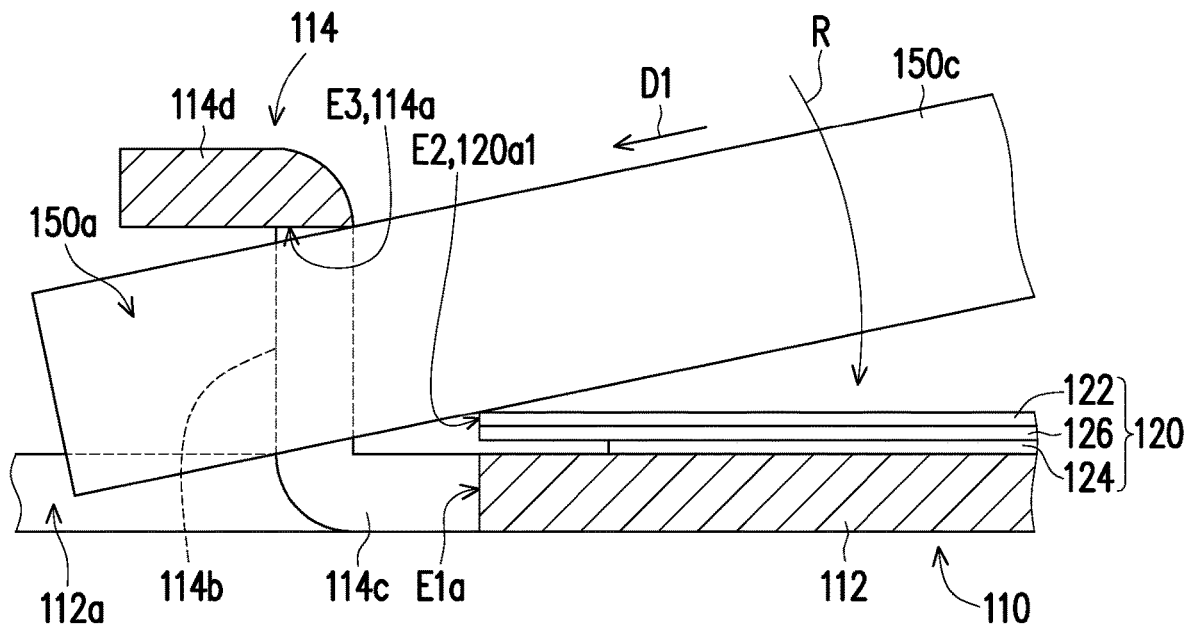
FIG. 9 is a schematic cross-sectional view of some components of a key structure according to another embodiment of the invention.
Figure 10:
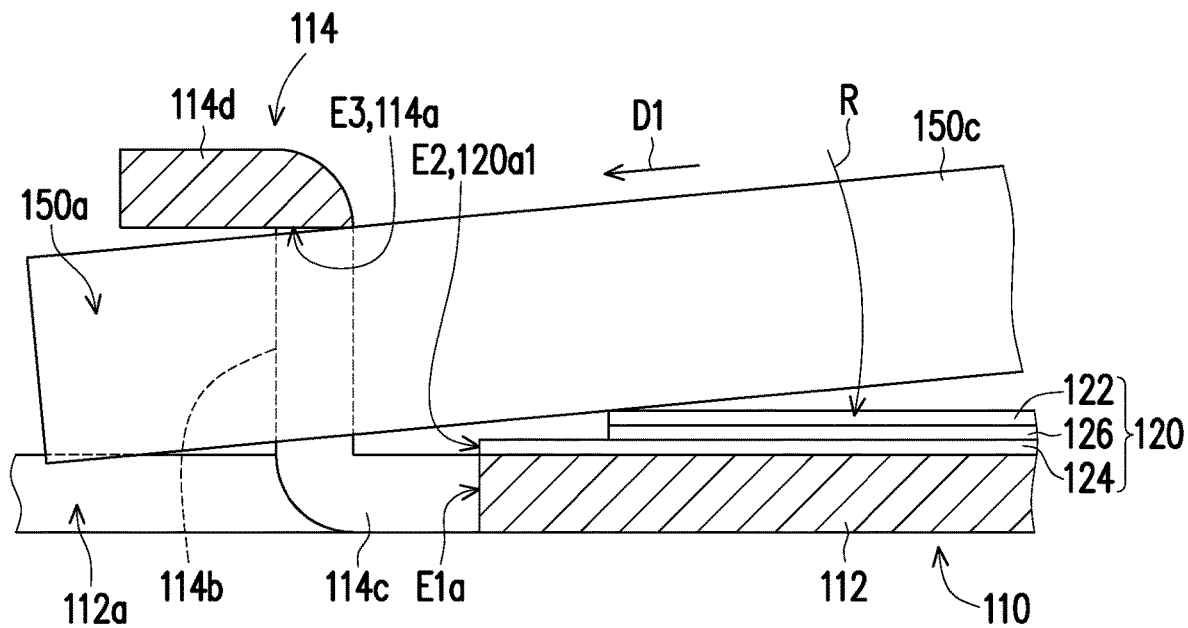
FIG. 10 is a schematic cross-sectional view of some components of a key structure according to another embodiment of the invention.

FIG. 7 is a schematic cross-sectional view of some components of a key structure according to another embodiment of the invention, and corresponds to the line I-I in FIG. 2. The embodiment shown in FIG. 7 is different from the embodiment shown in FIG. 5A in that the first circuit film layer 122 of the embodiment shown in FIG. 7 protrudes relative to the insulation layer 126 and the second circuit film layer 124 to form the side edge E2 of the second opening 120a of the thin film circuit assembly 120. FIG. 8 is a schematic cross-sectional view of some components of a key structure according to another embodiment of the invention, and corresponds to the line I-I in FIG. 2. The embodiment shown in FIG. 8 is different from the embodiment shown in FIG. 5A in that the insulation layer 126 of the embodiment shown in FIG. 8 protrudes relative to the first circuit film layer 122 and the second circuit film layer 124 to form the side edge E2 of the second opening 120a of the thin film circuit assembly 120. FIG. 9 is a schematic cross-sectional view of some components of a key structure according to another embodiment of the invention, and corresponds to the line I-I in FIG. 2. The embodiment shown in FIG. 9 is different from the embodiment shown in FIG. 5A in that the first circuit film layer 122 and the insulation layer 126 of the embodiment shown in FIG. 9 protrude relative to the second circuit film layer 124 to form the side edge E2 of the second opening 120a of the thin film circuit assembly 120. FIG. 10 is a schematic cross-sectional view of some components of a key structure according to another embodiment of the invention, and corresponds to the line I-I in FIG. 2. The embodiment shown in FIG. 10 is different from the embodiment shown in FIG. 5A in that the second circuit film layer 124 of the embodiment shown in FIG. 10 protrudes relative to the first circuit film layer 122 and the insulation layer 126 to form the side edge E2 of the second opening 120a of the thin film circuit assembly 120. In other embodiments, any other one or two of the plurality of film layers may protrude to form the side edge E2 of the second opening 120a of the thin film circuit assembly 120, or all film layers jointly form the side edge E2 of the second opening 120a of the thin film circuit assembly 120, which is not limited in the invention.

Figure 11:
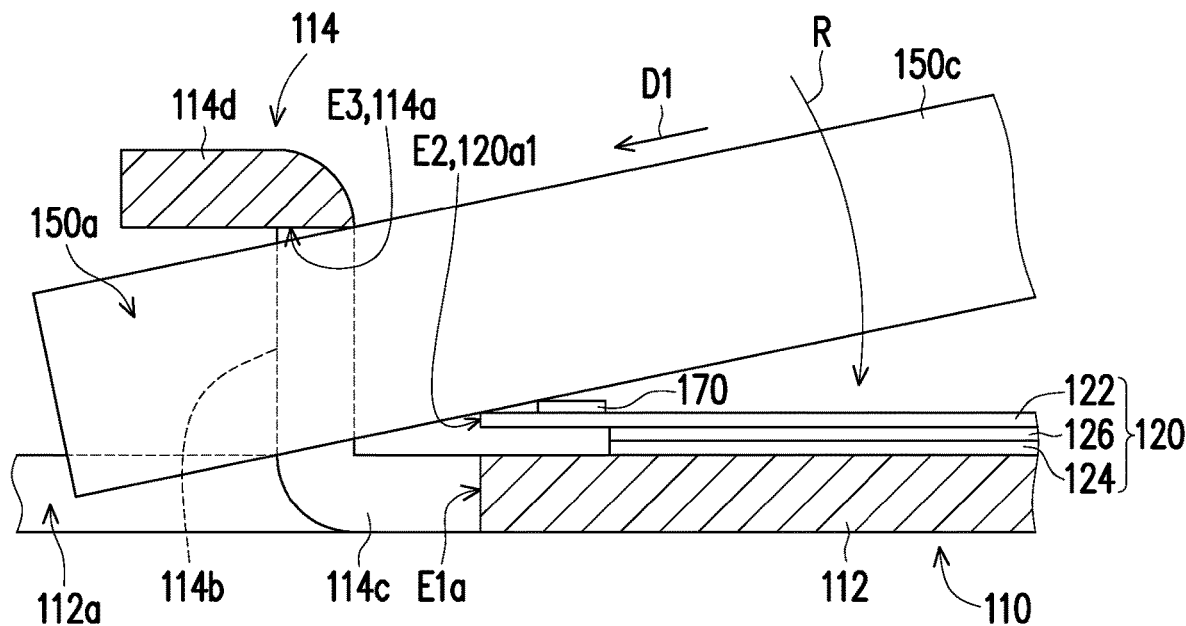
FIG. 11 is a schematic cross-sectional view of some components of a key structure according to another embodiment of the invention.

FIG. 11 is a schematic cross-sectional view of some components of a key structure according to another embodiment of the invention, and corresponds to the line I-I in FIG. 2. The embodiment shown in FIG. 11 is different from the embodiment shown in FIG. 7 in that the key structure 100 in FIG. 11 further includes a buffer layer 170. The buffer layer 170 is disposed on the thin film circuit assembly 120 and is close to the edge (close to the side edge E2) of the second opening 120a of the thin film circuit assembly 120, and is located between the thin film circuit assembly 120 and the lower portion of the free end 150a of the supporting rod 150. A material of the buffer layer 170 may include polyurethane, epoxy resin, foam, rubber, a coating with a buffering effect, or other suitable materials, which is not limited in the invention. Therefore, the buffering effect is further provided between the thin film circuit assembly 120 and the free end 150a of the supporting rod 150. It is worth noting that the foregoing buffering design shown in FIG. 7 to FIG. 11 may be applied to any embodiment of FIG. 3B to FIG. 3E, which is not limited in the invention.

Figure 12:
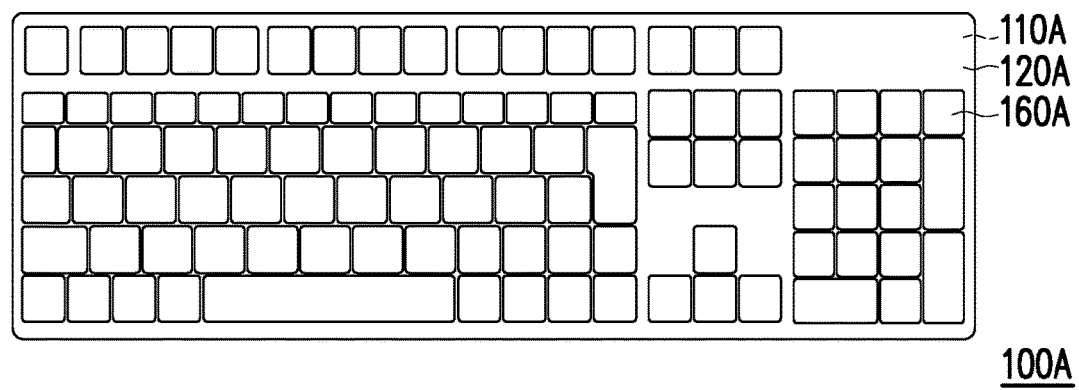
FIG. 12 is a schematic top view of a keyboard module according to an embodiment of the invention.

FIG. 12 is a schematic top view of a keyboard module according to an embodiment of the invention. In a keyboard module 100A in FIG. 12, configuration and an operation manner of a keycap 160A and a corresponding base plate 110A, thin film circuit assembly 120A, supporting mechanism, elastic contact assembly, and supporting rod are similar to configuration and an operation manner of the base plate 110, the thin film circuit assembly 120, the supporting mechanism 130, the elastic contact assembly 140, the supporting rod 150, and the keycap 160 of the foregoing embodiment, and the descriptions thereof are omitted herein. The keyboard module 100A in FIG. 12 is different from the key structure 100 of the foregoing embodiment in that there are a plurality of keycaps 160A and corresponding supporting mechanisms, elastic contact assemblies, and supporting rods to form the keyboard module 100A with a plurality of keys. Correspondingly, the base plate 110A includes a plurality of connecting seats with through holes. The through holes are the same as or similar to the through hole 114a of the foregoing embodiment, to allow the plurality of supporting rods to insert into. The plurality of keys may be pressed by a user to trigger the thin film circuit assembly 120A to execute an operation intended by the user, for example, inputting text, symbols, or numbers. In addition, the keyboard module 100A may include a plurality of buffer layers 170 shown in FIG. 11, and the plurality of buffer layers 170 is disposed on the thin film circuit assembly 120A and corresponds to the plurality of supporting rods 150.

Finally, it should be noted that the foregoing embodiments are merely intended for describing the technical schemes of the invention, but not for limiting the invention. Although the invention is described in detail with reference to the foregoing embodiments, it should be appreciated by persons of ordinary skill in the art that they may still make modifications to the technical schemes described in the foregoing embodiments or make equivalent replacements to some or all technical features thereof, without departing from the scope of the technical schemes of the embodiments of the invention.

What is claimed is:

1. A key structure, comprising:
    a base plate, comprising at least one connecting seat and at least one notch adjacent to a lower portion of the at least one connecting seat, wherein the at least one connecting seat comprises a through hole, and the notch is communicated with the corresponding through hole of the connecting seat;
    a keycap, disposed above the base plate;
    a thin film circuit assembly, disposed on the base plate and located between the base plate and the keycap, wherein the thin film circuit assembly comprises at least one opening, the at least one connecting seat protrudes out from the at least one opening, and a vertical projection region of the at least one notch on the base plate is located within a vertical projection region of the at least one opening of the thin film circuit assembly on the base plate; and
    a supporting rod, connected to the keycap and the base plate and located between the thin film circuit assembly and the keycap, wherein a free end of the supporting rod is inserted into the through hole, and a lower portion of the free end of the supporting rod abuts against an edge of the at least one opening of the thin film circuit assembly,
    wherein the base plate comprises a main body, and the at least one connecting seat is substantially perpendicularly disposed relative to the main body,
    wherein the at least one notch forms an accommodating space on the main body of the base plate, and the accommodating space extends from the through hole and is communicated with the through hole,
    wherein the at least one notch comprises a first and a second side edges which are opposite to each other, and a third and a fourth side edges which are opposite to each other, and an extending direction of the accommodating space from the through hole on the base plate is opposite to an insertion direction of the free end of the supporting rod into the through hole.

2. The key structure according to claim 1, wherein the at least one notch penetrates through the main body of the base plate.

3. The key structure according to claim 1, wherein any edge of the at least one opening of the thin film circuit assembly is flush with or does not extend over any side edge of the at least one notch.

4. The key structure according to claim 3, wherein the free end abuts against the edge of the at least one opening which is located at a direction away from the free end and abuts against an inner edge of the through hole of the at least one connecting seat which is located at an end and away from the main body of the base plate.

5. The key structure according to claim 3, wherein the thin film circuit assembly comprises a plurality of film layers, at least one of the plurality of film layers protrudes out relative to other film layers.

6. The key structure according to claim 5, wherein the plurality of film layers comprise a first circuit film layer, a second circuit film layer, and an insulation layer, and the insulation layer is disposed between the first circuit film layer and the second circuit film layer.

7. The key structure according to claim 1, wherein the key structure further comprises a buffer layer, the buffer layer is disposed on the thin film circuit assembly and is close to the edge of the at least one opening, so that the buffer layer is located between the thin film circuit assembly and the lower portion of the free end of the supporting rod.

8. The key structure according to claim 3, wherein the key structure further comprises a buffer layer, the buffer layer is disposed on the thin film circuit assembly and is close to the edge of the at least one opening, so that the buffer layer is located between the thin film circuit assembly and the lower portion of the free end of the supporting rod.

9. The key structure according to claim 5, wherein the key structure further comprises a buffer layer, the buffer layer is disposed on the thin film circuit assembly and is close to the edge of the at least one opening, so that the buffer layer is located between the thin film circuit assembly and the lower portion of the free end of the supporting rod.

10. The key structure according to claim 7, wherein a material of the buffer layer is polyurethane, epoxy resin, foam, or rubber.

11. The key structure according to claim 8, wherein a material of the buffer layer is polyurethane, epoxy resin, foam, or rubber.

12. The key structure according to claim 9, wherein a material of the buffer layer is polyurethane, epoxy resin, foam, or rubber.

13. The key structure according to claim 1, wherein the key structure further comprises a supporting mechanism, and the supporting mechanism is connected between the base plate and the keycap.

14. The key structure according to claim 1, wherein the key structure further comprises an elastic contact assembly, and the elastic contact assembly is disposed on the thin film circuit assembly and is located between the thin film circuit assembly and the keycap.

15. The key structure according to claim 1, wherein the notch is a recessed/dented part that does not pass through the main body of the base plate to expose a bearing surface.

16. The key structure according to claim 15, wherein the free end of the supporting rod is embedded into the notch and abuts against an edge of the bearing surface.

17. A keyboard module, comprising: at least one key structure according to claim 1.

18. The key structure according to claim 1, wherein the at least one notch does not penetrate through the main body of the base plate.

\* \* \* \* \*